United States Patent [19]
Merrill et al.

[11] Patent Number: 5,475,335
[45] Date of Patent: Dec. 12, 1995

[54] HIGH VOLTAGE CASCADED CHARGE PUMP

[75] Inventors: Richard B. Merrill, Daly City; Whu-ming Young, Palo Alto, both of Calif.

[73] Assignee: National Semiconductor Corporation, Santa Clara, Calif.

[21] Appl. No.: 319,902

[22] Filed: Oct. 7, 1994

Related U.S. Application Data

[62] Division of Ser. No. 221,602, Apr. 1, 1994.

[51] Int. Cl.[6] ............................... G05F 1/10; G05F 3/02
[52] U.S. Cl. ........................... 327/536; 327/537; 327/544
[58] Field of Search ...................... 327/536–537, 327/544

[56] References Cited

U.S. PATENT DOCUMENTS

| | | | |
|---|---|---|---|
| 5,036,229 | 7/1991 | Tran | 307/497 |
| 5,319,604 | 6/1994 | Imondi et al. | 365/230.06 |

OTHER PUBLICATIONS

John Goldie, et al., "Inter–Operation of the DS14C335 with +5V UARTs", Jan. 1993, *National Semiconductor.*
Y. Okazaki, et al., "Characteristics of a New Isolated p–Well Structure Using Thin Epitaxy Over the Buried Layer and Trench Isolation", *IEEE Trans. on Electron Devices,* vol. 39, No. 12, Dec. 1992.
M. Declercq, et al., "TP 10.6: 5V–to–75V CMOS Output Interface Circuits", *IEEE Intl. Solid–State Circuits Conf.,* Feb. 1993, pp. 162–163.

*Primary Examiner*—Margaret Rose Wambach
*Attorney, Agent, or Firm*—Skjerven, Morrill, MacPherson, Franklin & Friel; Norman R. Klivans

[57] ABSTRACT

A cascaded charge pump includes multiple stages each providing a (nominal) 3 volt increment. Thus a charge pump having an 18 volt range is provided using a CMOS process which normally then allows integration on a single integrated circuit chip of a complex digital logic function such as a UART (universal asynchronous receiver and transmitter) with a high voltage function such as an RS-232 interface, including integrated capacitors for the RS-232 interface charge pump.

7 Claims, 9 Drawing Sheets

HIGH VOLTAGE CASCADED CHARGE PUMP

This application is a division of application Ser. No. 08/221,602, filed Apr. 1, 1994.

BACKGROUND OF THE INVENTION

1. Field of the Invention

This invention relates to integrated circuits and more specifically to a high voltage charge pump circuit including transistors formed by a low voltage CMOS semiconductor fabrication process.

2. Description of the Prior Art

It is well known in the field of integrated circuits to fabricate field effect transistors capable of operating at a high voltage. Other field effect transistors which are capable of operating at only a low voltage have the advantage of a higher capacitance and current carrying capability per unit area. Typically, such low voltage transistors are also advantageously considerably smaller in terms of surface area (of higher density) and also involve shallower diffusions than do the high voltage transistors; they are thus easier and less expensive to fabricate. Most digital logic semiconductor circuits use such low voltage (i.e., 2 to 5 volts source-to-gate potential) field effect transistors. In contrast, the high voltage field effect transistors typically require thicker gate oxide, deeper diffusions, and greater surface area in order to withstand the higher voltages (typically exceeding 5 volts source-to-gate potential). The processes to fabricate respectively low voltage and high voltage field effect transistors thus differ considerably, and in the prior art such high and low voltage transistors cannot be fabricated using the same series of process steps.

This becomes a significant limitation when one wants to combine in a single integrated circuit both a high voltage circuit and a low voltage circuit. In that case, it is known to provide a high voltage/low voltage interface as described in the publication "5 V-to-75 V CMOS Output Interface Circuits", Declercq et al., 1993 IEEE International Solid State Circuits Conference, p. 162–163. This publication describes combining low cost, low voltage standard CMOS logic with high voltage CMOS output buffers on the same chip, using a standard unmodified low voltage CMOS processing technology and using level shift techniques to meet the constraints on the gate control signal voltages. Thus the gate-to-source voltage swing of the output devices (which are the high voltage transistors) are within the safe operating limits of the low voltage transistors.

However, it has been found that this solution has several drawbacks. One is that the N channel transistors, typically formed in a P well in the semiconductor substrate, are not effectively isolated electrically from the substrate. Also, problematically for high voltage P channel transistors, there is punch through to the substrate. This is because the N well is relatively shallow beneath the P-field drain region in accordance with the low voltage fabrication technique. This limits the voltage that the P channel transistors can withstand (i.e., to below 30 V).

Therefore, there is a need to combine high density low voltage standard CMOS logic transistors with CMOS transistors operating at high voltage on the same chip and fabricated using a low voltage CMOS technology, without the drawbacks of the technique of the above-referenced publication.

SUMMARY OF THE INVENTION

A charge pump includes a cascaded set of individual charge pump stages, and each stage includes isolated transistors operating at high voltage. This generates, from a single low voltage source, an incremental set of output voltages with a range considerably greater than that of the input voltage, using a switching network. For instance, with a 3 volt input voltage it is possible with five charge pump stages to provide a +9 volt/–9 volt range. Each charge pump stage has its own circuits completely isolated by an isolation layer in a semiconductor substrate.

Also in accordance with the invention, an N type buried doped electrical isolation layer is formed in a integrated circuit substrate, underlying both P channel and N channel low voltage type transistors. This isolation layer creates on the substrate isolated areas of arbitrary voltages, and thereby allows some of the transistors, which are otherwise of a low voltage architecture, to operate at high voltages relative to a potential level of the source region or transistor well or substrate. (It is to be understood that in contrast the gate-to-source potential is process related.) These transistors allow fabrication on a single integrated circuit of a charge pump having a high voltage output, fabricated by what otherwise is a low voltage CMOS type process. Thus this process is compatible with low voltage logic-type CMOS transistors formed on the same chip and in the same sequence of processing steps. In other words, in accordance with the invention isolated power/ground P-channel and N-channel transistor pairs are fabricated which operate at any potential relative to a common substrate.

The combination on a single chip of such a high voltage charge pump with digital logic operating at low voltage allows the combination of a UART (universal asynchronous receiver/transmitter) circuit with a high voltage RS-232 driver circuit on the single chip. This can also eliminate the external capacitors normally required for such a high voltage RS-232 driver circuit, and substitute on-chip capacitors, due to the high operating frequency of the circuit and the thin (high dielectric) gate oxide which advantageously are by-products of the basic CMOS low voltage fabrication process.

This combination of the low voltage UART circuit and the high voltage RS-232 driver circuit on one integrated circuit chip is exemplary of the advantages of the invention, in combining low voltage CMOS logic circuitry with high voltage input/output devices on a single chip using essentially a low voltage fabrication process. Thus advantageously one can take a fine line (fine geometry, i.e. sub-1 micron) CMOS fabrication process and adapt it to a high voltage circuit. The generic application is where high density CMOS logic (low voltage) interfaces to a high voltage circuit. One typical application is for automobile electronics, where a 12 volt circuit is frequently used for carrying data signals as well as power.

The use of the isolation buried layer located below both the N channel transistors and the P channel transistors in the high voltage "islands" provides considerably higher working voltage than in the prior art low voltage CMOS processes.

3 tion layer under MOS transistors.

Figure 3:
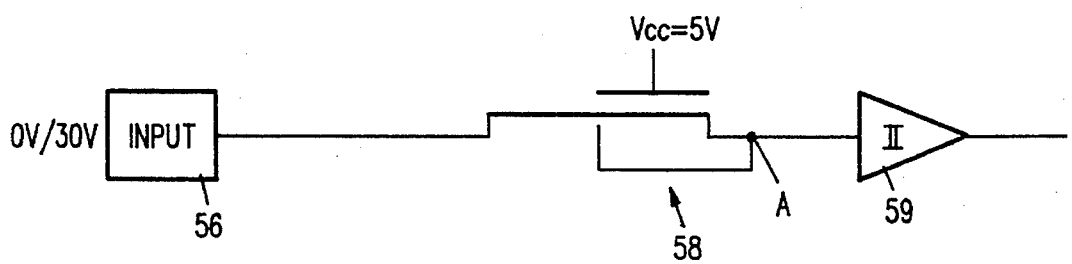
Figure 4A:
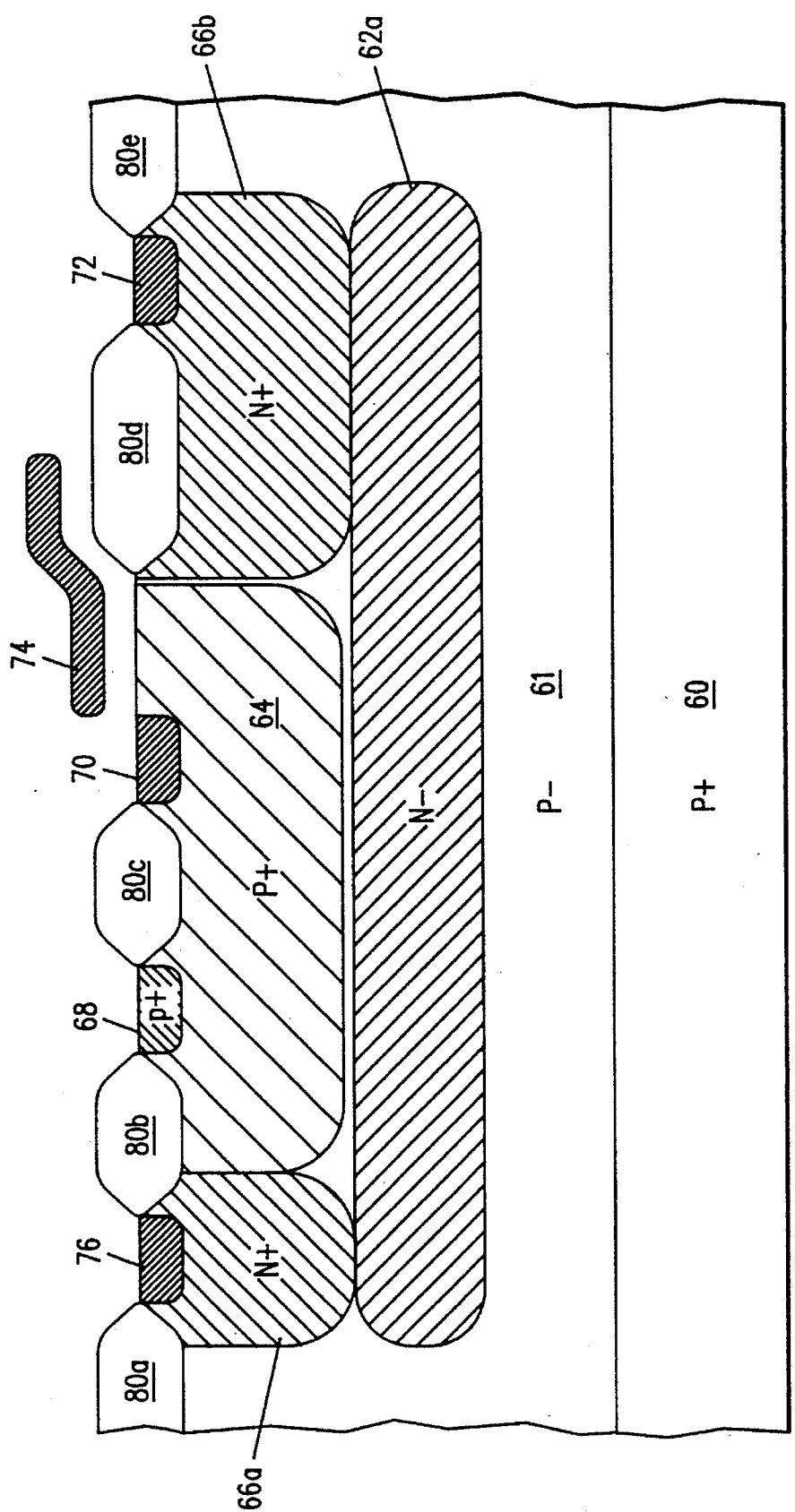
Figure 4B:
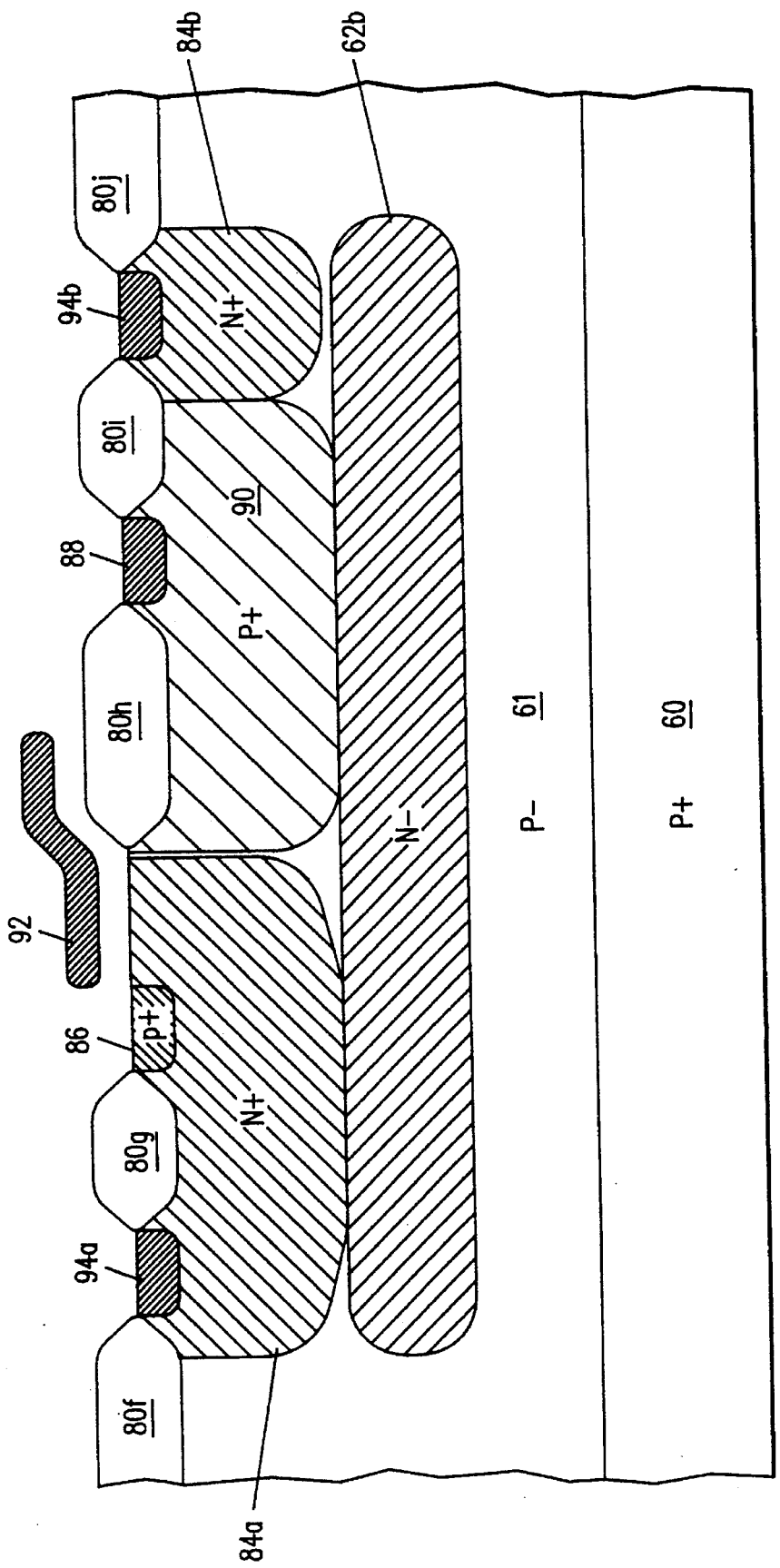

FIG. 3 shows use of the transistors of FIGS. 4a and 4b.

FIG. 4a shows an N channel high voltage transistor with the N isolation layer.

FIG. 4b shows a P channel high voltage transistor with the N isolation layer.

Figures 5A, 5B:
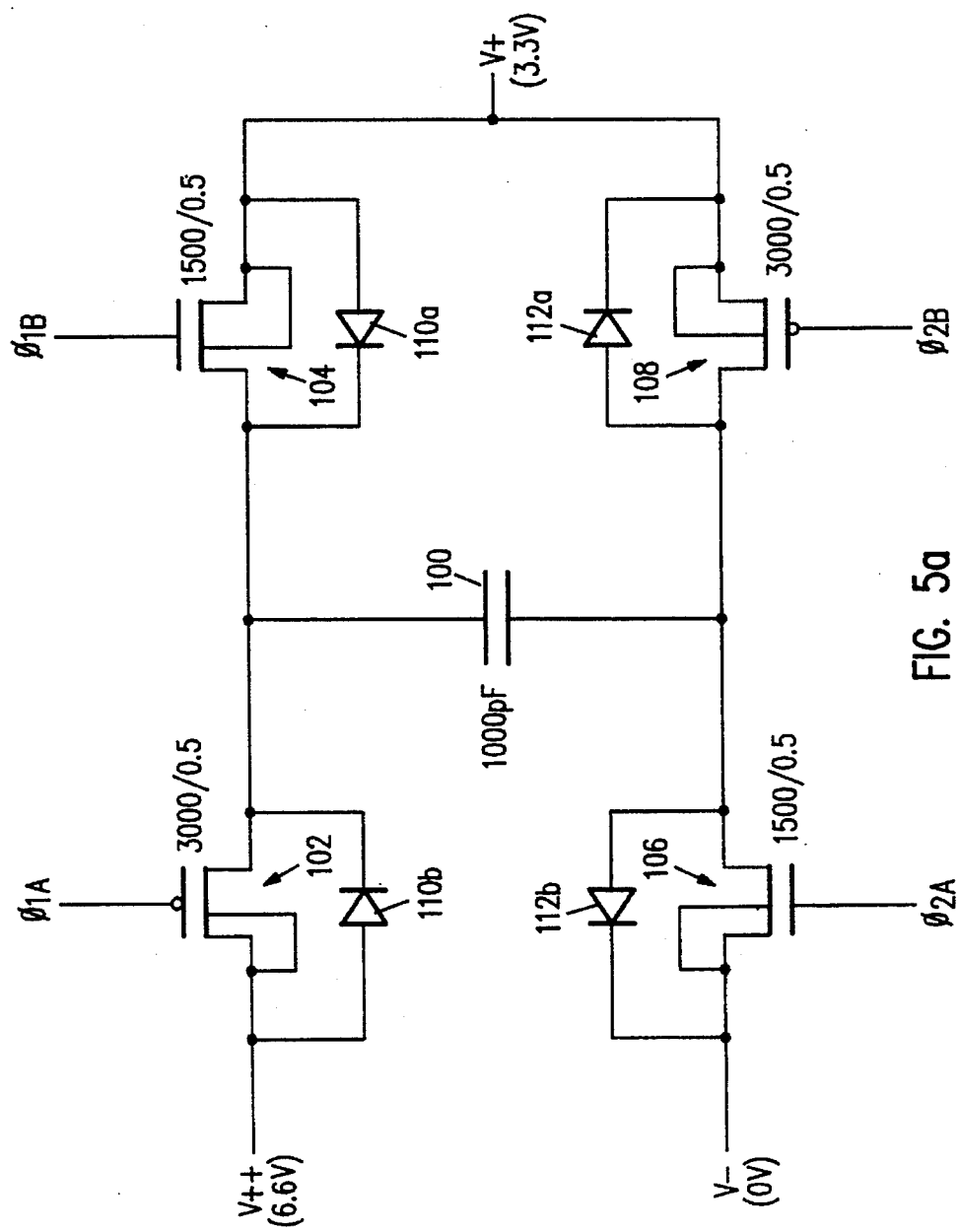

FIG. 5a shows a charge pump cell.

FIG. 5b shows timing for the cell of FIG. 5a.

Figure 6:
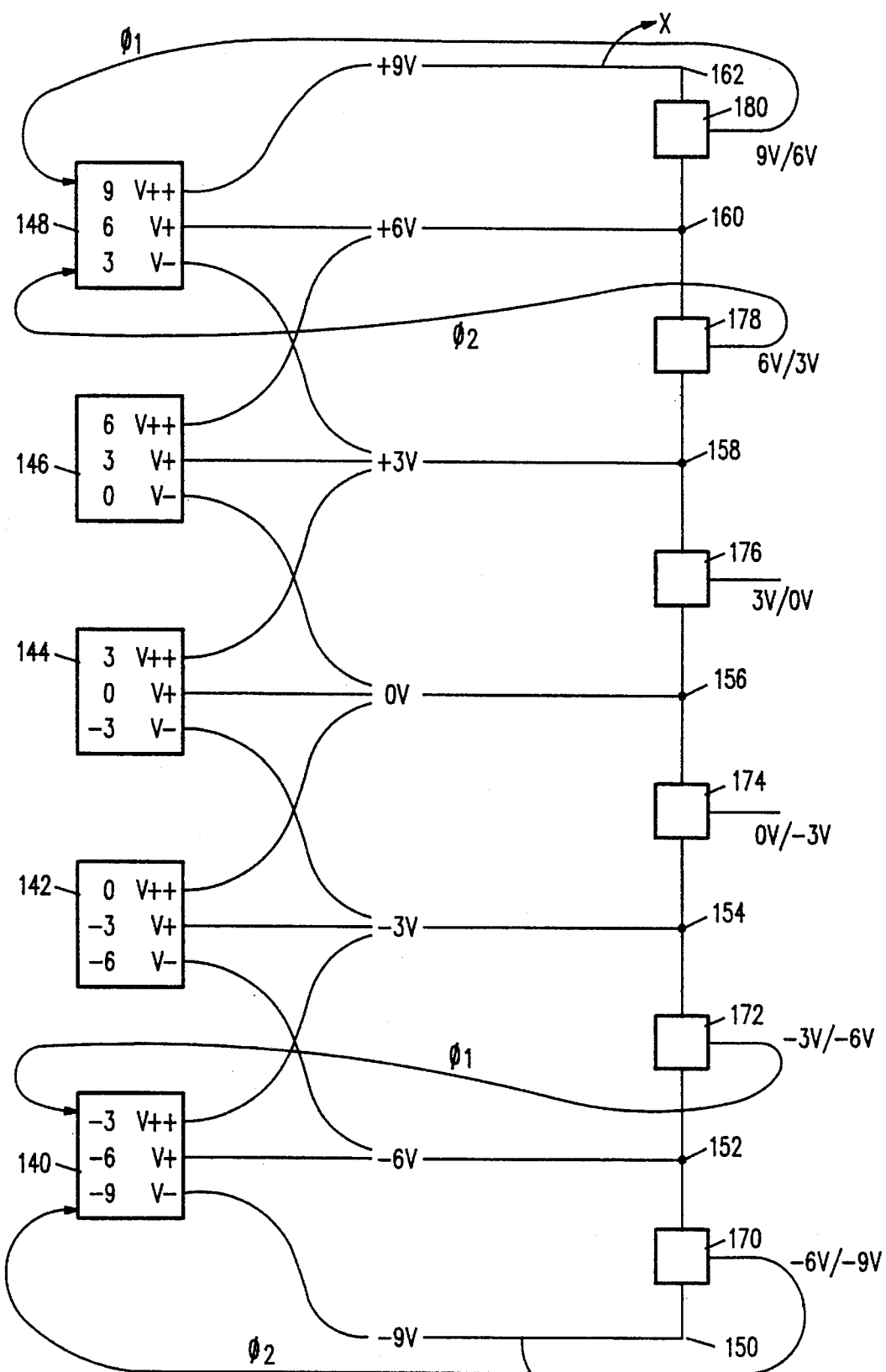

FIG. 6 shows a cascaded charge pump.

Figure 7:
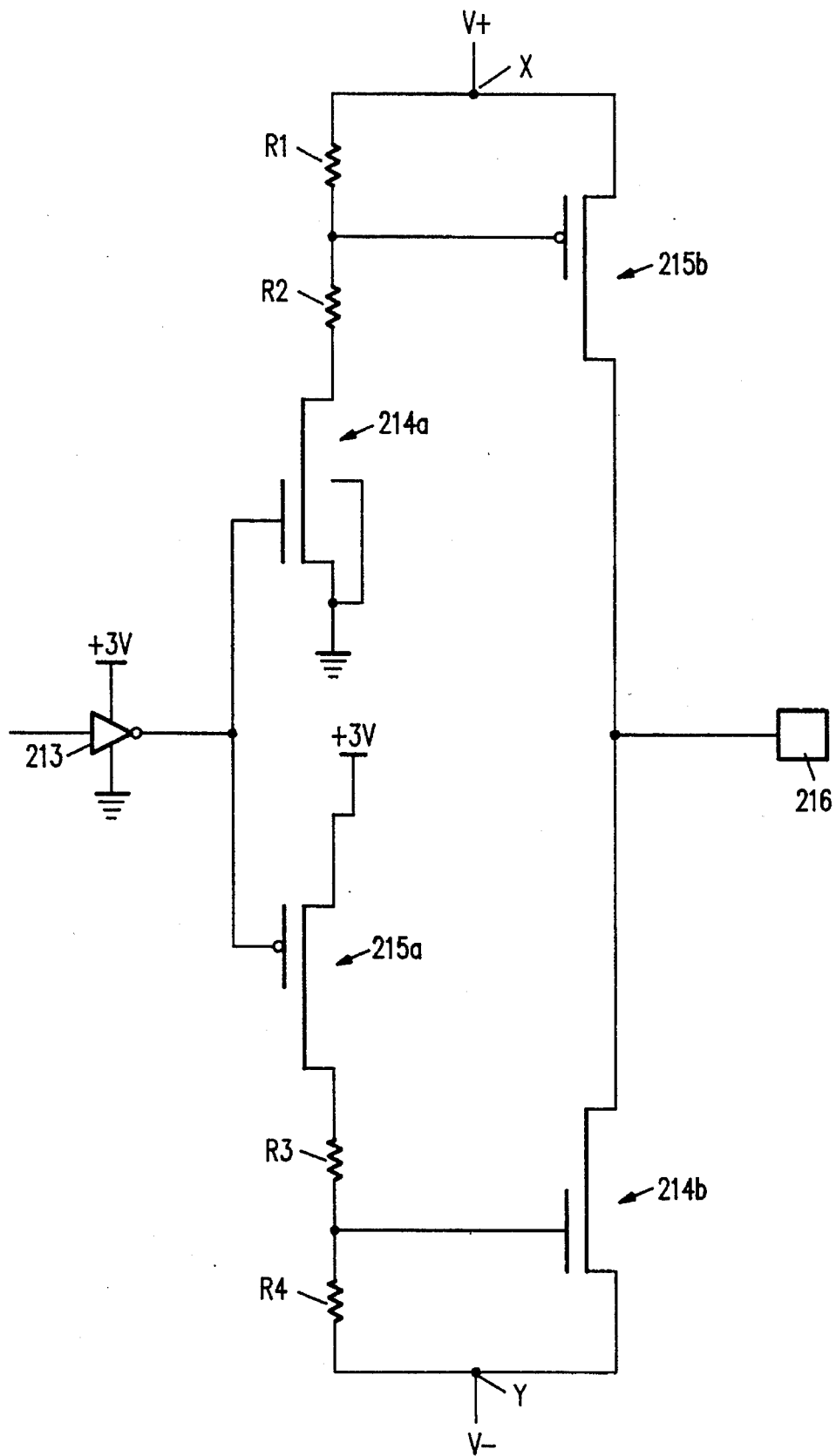

FIG. 7 shows a high voltage driver and level shift circuit.

Figure 8:
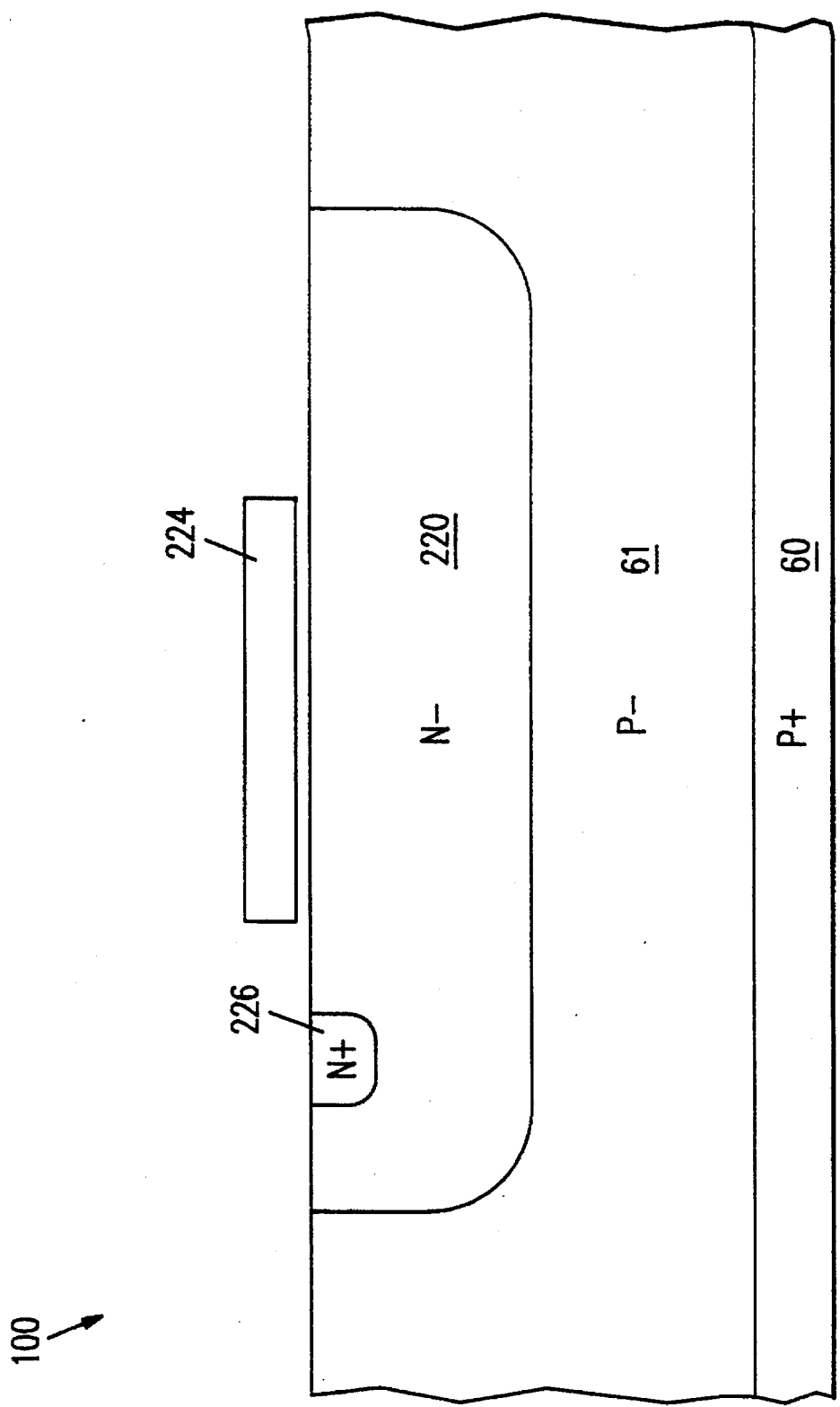

FIG. 8 shows a capacitor structure.

Figure 9:
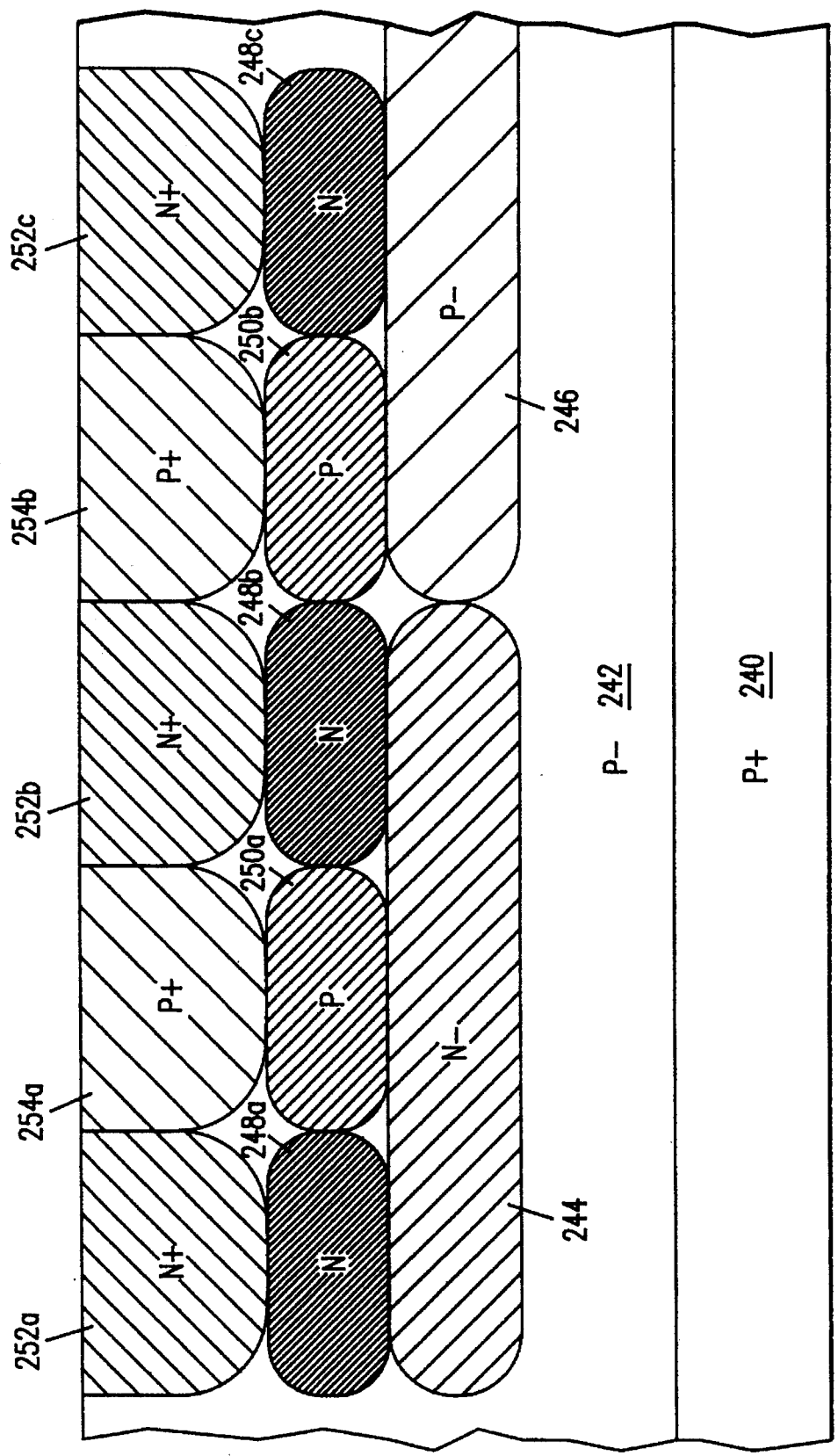

FIG. 9 shows a cross section of a semiconductor structure in accordance with the present invention.

DETAILED DESCRIPTION OF THE INVENTION

Figure 1:
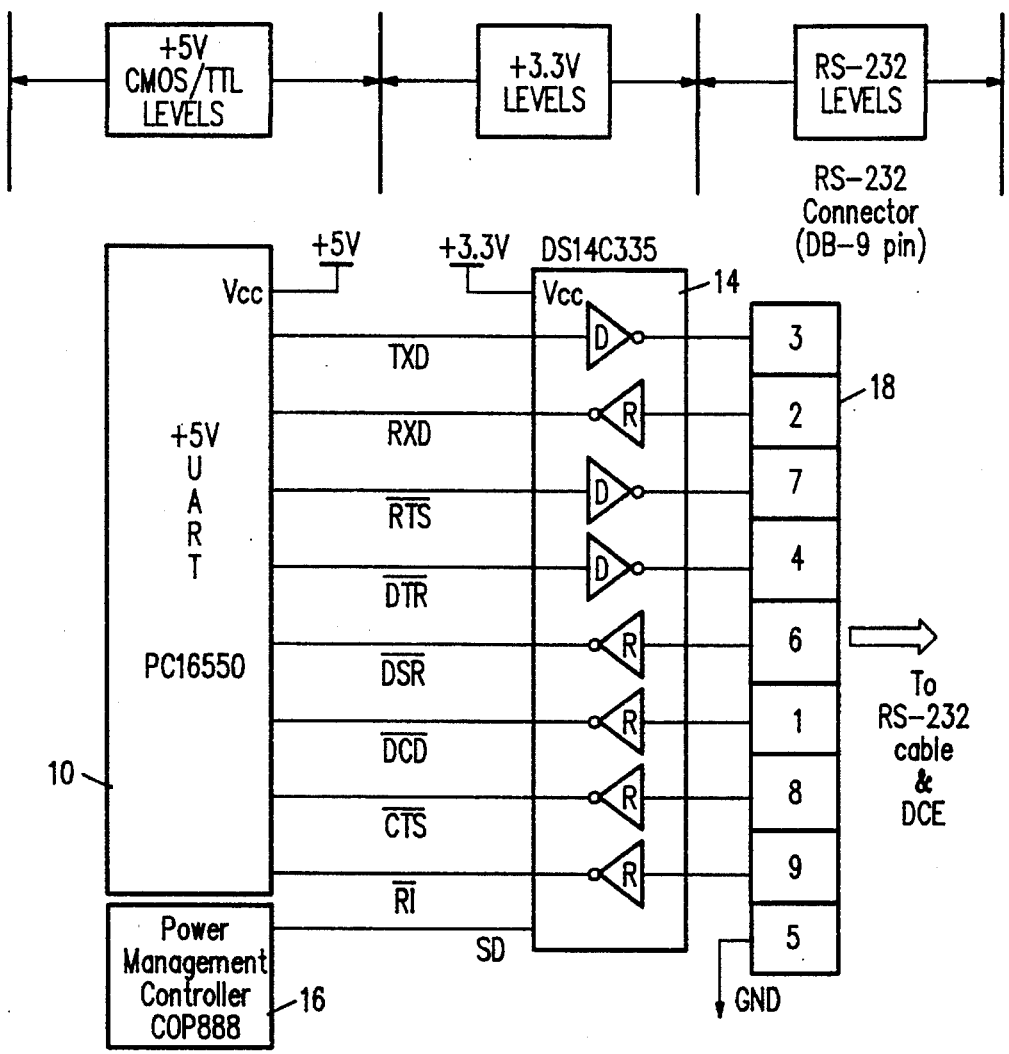
FIG. 1 shows a prior art circuit including a UART chip and an RS-232 driver chip.

FIG. 1 shows a prior art circuit combining (1) a UART chip 10 (e.g. National Semiconductor part number PC16550) which operates as shown, typically at +5 volts CMOS/TTL voltage levels connected to (2) an RS-232 driver/receiver chip 14 (e.g. National Semiconductor part number DS14C335) which operates internally at high voltages. The signal lines between the UART 10 and RS-232 driver 14 are shown, conventionally labeled TXD, RXD, etc. Also included in this circuit is conventional power management controller chip 16 (e.g. National Semiconductor part number COP8888). The functionality and structure of each of these parts is known in the art. In this prior art, the UART 10 and RS-232 driver 14 of necessity are on separate chips. Although the RS-232 driver 14 is shown as operating at +3.3 volts, in fact it requires typically an internal voltage supply of +9 volts to −9 volts to drive the signals to the RS-232 connector 18, which as shown connects to an RS-232 cable and to typically digital communication equipment (DCE) for use e.g. in a computer network.

The driver circuitry in the RS-232 driver 14 provides a translation from the TTL/CMOS voltage levels to the RS-232 driver output voltage levels at 3.3 volts. The receiver portion of chip 14 accepts standard RS-232 input voltage levels and translates them back to TTL/CMOS compatible output voltage levels for input to UART chip 10.

In accordance with the invention, the circuitry of these two chips 10, 14 plus some external components (capacitors) is combined onto a single chip, saving both space and power, making this single chip ideal for use in portable applications such as a notebook computer. The method and structure by which this exemplary combination of transistors operating at high and low voltages is formed on a single chip are disclosed hereinafter.

This combination is achieved using an N type doped isolation buried layer formed in the chip substrate. Such an isolation layer is known for use in low voltage CMOS circuitry. See for instance "Characteristics of a New Isolated P-Well Structure Using Thin Epitaxy Over the Buried Layer and Trench Isolation", Okazaki et al., *IEEE Transactions on Electron Devices*, Vol. 39, No. 12, December 1992, pp. 2758–2764. This publication describes using an N+ buried layer on top of which is grown an N type epitaxial layer in which is formed the active portions of the transistors. In the prior art, such isolation layers typically isolate P wells so as to reduce cross talk, in order to provide general isolation of the P wells on an N well CMOS fabrication process. It is believed that such an isolation layer has not been used in the prior art in the context of fabricating transistors capable of operating at arbitrary voltage levels. That is, the prior art use was for logic-type CMOS transistors, typically operating at 3 volts or less differential between the drain and the source or well or substrate of the transistors, but where isolation from a high voltage portion of the chip was not involved.

Figure 2:
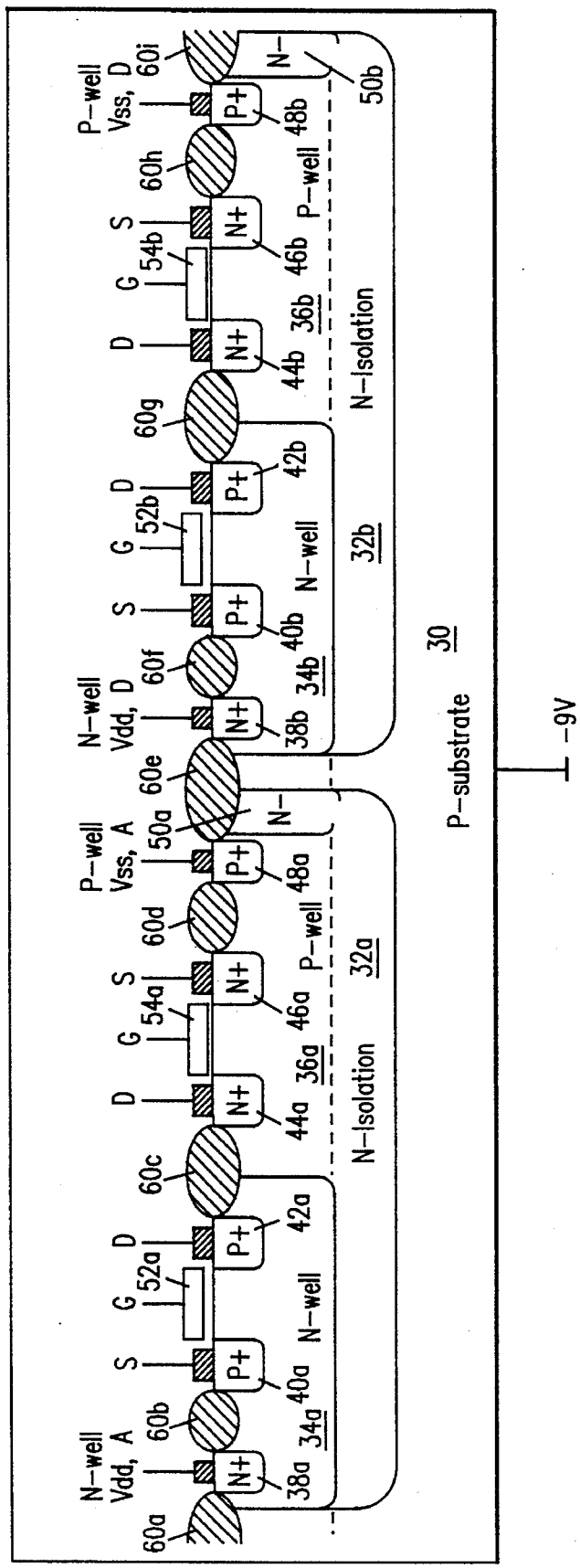
FIG. 2 shows a portion of a semiconductor substrate incorporating in accordance with the invention an N-isola-

FIG. 2 shows in accordance with the invention use of the N isolation buried layer beneath MOS P channel and N channel transistor pairs, in order to create completely isolated circuits. In accordance with the invention this isolation is used for the RS-232 driver/UART interface. As described above, the RS-232 driver requires that −9 volts be switched on chip to +9 volts, meaning that the P− substrate is connected to a negative 9 volt potential. Unacceptable back bias would occur on the UART N channel transistors, resulting in high threshold voltage and performance degradation, without this N-isolation. Also, as described in detail below, multiple $V_{CC}/V_{SS}$ (power/ground) voltage levels are used to partition the +9 volt/−9 volt supply range into nominally 3 volt increments so that an optimized CMOS fabrication process for 3.3 volt transistors cam be used in the charge pump circuitry.

As shown in FIG. 2, N isolation layer 32a, 32b which is a buried layer formed on a P− doped substrate 30, provides isolated power and ground for the various islands (groups) of transistors shown for a portion of the UART. Substrate 30 is biased to −9 volts as shown. The first portion 32a of the N-isolation layer isolates two transistors associated with the UART, one formed in N doped well (tub) 34a and the second formed in P doped well 36a. The first transistor in N well 34a includes P+ doped source region 40a, P+ doped drain region 42a, and conductive gate electrode 52a. The respective contacts are labelled S, D, and G. Also shown is conventional N well contact region 38a which is N+ doped and connected to a low voltage $V_{dd}$, e.g. 3.3 volts (nominally 3 volts).

A second transistor formed in the P well 36a with reversed conductivity types includes N+ doped drain region 44a, N+ doped source region 46a, gate electrode 54a, P+ doped source region 46a, and P+ doped P well contact region 48a connected to $V_{SS}$ which is ground (0 volts). Structures 60a, . . . , 60i are the conventional field oxide regions; the conventional gate oxide layer is not illustrated, for simplicity.

On the right hand side, an identical set of transistors for the RS-232 driver is shown with corresponding reference numbers but having the "b" suffix. On the right hand side overlying the N isolation layer 32b, the N well contact region 38b is connected to the RS-232 driver voltage $V_{dd}$ (+9 volts) and the P well contact region 48b is connected to the RS-232 driver voltage $V_{SS}$ (+6 volts). Thus the left hand side represents the transistors operating at low voltage and the right hand represents the transistors operating at high voltage, as described above. This isolation effect is achieved by the N isolation layers 32a, 32b.

FIGS. 4a and 4b illustrate isolated high voltage transistors differing somewhat from those of FIG. 2. An application of the transistors of FIGS. 4a and 4b is shown in FIG. 3. An input signal of 0 to 30 volts is applied at input node 56 to the source terminal of transistor 58, the gate terminal of which is connected to supply voltage $V_{CC}$ of 5 volts. Node A charges to $V_{CC}-V_{TN}$ (where $V_{TN}$ is the transistor threshold voltage). $V_{CC}-V_{TN}=5$ V−0.7 V=4.3 V at node A for the isolated transistors of FIGS. 4a and 4b. In contrast, for a prior art non-isolated transistor, the value of $V_{CC}-V_{TN}=5$ V−2 V=3 V at node A. Thus the 4.3 V signal is a better logic "1" ("high") than is the prior art 3 V. The 4.3 V signal in this example is an input signal to Schmitt trigger 59.

FIG. 4a shows how the above described N isolation buried layer and a low voltage CMOS process N well transistor are combined to create a completely isolated N channel transistor capable of operating at arbitrary (e.g. high) voltages relative to the substrate, and here referred to for convenience as a "high voltage transistor". The transistors of FIGS. 4a and 4b hence illustrate another use of the N isolation layer to create transistors capable of operating at such arbitrary voltages relative to the substrate. This structure as in FIG. 4a includes substrate 60 which is doped P+ and biased in operation to −9 V. Overlying P+ substrate 60 is P− epitaxial layer 61. In the central portion of P− epitaxial layer 61 the N doped isolation ("N-ISO") buried layer 62a is formed. Overlying layer 62a is P− doped well 64 which is laterally isolated by N− doped wells 66a, 66b. Formed on the upper portion of epitaxial layer 61 is P+ doped body region 68, N+ doped source region 70, and N+ doped drain region 72. Overlying the principal surface of the structure is conventional doped polysilicon gate electrode 74, which is isolated by a conventional (low voltage) relatively thin gate oxide layer (not shown). Also formed in N-well 66a is a conventional N-well N+ doped contact region 76. Also shown are field oxide regions 80a, 80b, 80c, 80d and 80e.

The corresponding P channel high voltage transistor shown in FIG. 4b (also formed on substrate 60 and using the same set of process steps as the transistor of FIG. 4a) includes the N-isolation layer 62b used in combination with a P well transistor. This transistor solves a problem with prior art P well transistors, namely the problematic low breakdown voltage between the P+ doped drain region 88 and the P− doped epitaxial layer 61. Also shown are N− doped wells 84a, 84b, P+ doped source region 86, P− doped well 90, gate electrode 92, N+ doped N-well contact regions 94a, 94b, and field oxide regions 80f, 80g, 80h, 80i, and 80j.

FIG. 5a shows a circuit cell (stage) for a charge pump which attains the voltage levels needed for the RS-232 driver circuit described above. This circuit is similar to that of the cascaded charge pump which is in the National Semiconductor RS-232 driver circuit (part number DS14C335), in that initially the bottom plate of pump capacitor 100 is charged up to 3.3 volts while the top plate is at 0 volts. Then the top plate is disconnected and the bottom plate (towards the lower part of the drawing) is charged up an additional 3.3 volts, resulting in a potential of 6.6 volts between the top and bottom plates. Transistors 104 and 106 are N channel transistors, and transistors 102 and 108 are P channel transistors. Transistors 102, 104, 106, 108 act as switches operated respectively by clock signals $\phi_{1A}$, $\phi_{1B}$, $\phi_{2A}$, $\phi_{2B}$ to connect/disconnect the top and bottom plates of capacitor 100. The size (length by width) of the gate electrode of each transistor is shown (in μm) by the numerals adjacent each transistor symbol.

Parasitic Schottky diodes 110a, 110b, 112a, 112b are used for the pump stage startup period, since the clock signals $\phi_{1A}$, $\phi_{1B}$, $\phi_{2A}$, $\phi_{2B}$ operating to pump the pump stage to the next higher voltage level (and which are respectively pulses varying between 6 volts and 3 volts and 3 volts and 0 volts), are not available until the pump capacitor 100 charges up. Thus transistors 104 and 108 will not be operating as switches during the startup period. During the startup period, the action of Schottky diodes 110a and 112a bypasses the switching action of respective transistors 104 and 108. Similarly, diodes 110b, 112b bypass respective transistors 102, 106. The operation of the charge pump is that the supply voltages V+ (at 3.3 volts) and V− (at 0 volts) result in an output voltage V++ of 6.6 volts. The clock signals $\phi_{1A}$, $\phi_{1B}$, $\phi_{2A}$, $\phi_{2B}$ are provided by an e.g. on-chip oscillator (not shown here and described in more detail below) operating for example at a frequency of approximately 50 MHz and a 50% duty cycle.

Thus advantageously the charge pump stage of FIG. 5a is in effect a self-contained (isolated) entity operating within its own particular nominal 3 volt pump increment. The transistors 102, 104, 106 and 108, being of the low voltage type are advantageously fabricated using a fine line i.e. 0.5 micron (μm) process, thus being relatively small in size and hence economical of chip surface area. This is in contrast to the prior art high voltage charge pump transistors in the RS-232 driver chip of FIG. 1 which are typically of the size 10,000 μm by 4 μm.

The charge pump cell of FIG. 5 operates in two phases, with the clock signals $\phi_{1A}$, $\phi_{1B}$ operating from 3 volts to 6 volts and the clock signals $\phi_{2A}$, $\phi_{2B}$ operating from 0 volts to 3 volts. In the first phase clock signals, $\phi_{1A}$, $\phi_{1B}$, $\phi_{2A}$, $\phi_{2B}$ are high so that transistor 104 is on, which means that the upper plate of transistor 100 is connected to node V+ (3.3 volts). Since clock signals $\phi_{2A}$, $\phi_{2B}$ are also high, this connects the lower plate of capacitor 100 to node V− (0 volts).

In the second phase, clock signals $\phi_{1A}$, $\phi_{1B}$, $\phi_{2A}$, $\phi_{2B}$ are low. Thus in the second phase transistor 102 is on, connecting the upper plate of capacitor 100 to node V++ and similarly with clock signals $\phi_{2A}$, $\phi_{2B}$ low, the lower plate of capacitor 100 is connected to node V+.

The timing relationships between clock signals $\phi_{1A}$ and $\phi_{1B}$ and between $\phi_{2A}$ and $\phi_{2B}$ are illustrated in FIG. 5b, with the horizontal axis being time, and the vertical axis being signal amplitude.

In the charge pump cell of FIG. 5a, the value of capacitor 100 is determined as being a capacitance equal to the current divided by the change of voltage with respect to time. In this example the current (a function of the clock speed and capacitor 100 value) is a useful level of 10 milliamps, and the change in voltage is 0.2 volts per 20 nanoseconds (corresponding to 50 MHz clock frequency). Thus the capacitance is 1,000 pF. To determine the size of a semiconductor capacitor structure providing this capacity, given a capacitance of gate oxide of 3.1 pF per μm$^2$, one requires 3×10$^5$ μm$^2$ (465 square mils) to provide the required 1000 pF.

FIG. 6 shows an embodiment of a cascaded charge pump, in this case using five charge pump stages 140, . . . , 148. Each charge pump stage has the three output terminals as in FIG. 5a, again labeled V−, V+ and V++. In this example each stage provides a nominal 3 volt charge pump increment (understood to actually be, as in FIG. 5a, the 3.3 volt increment provided by the CMOS transistors of the type shown in FIG. 2). It is to be understood that the number of stages is dependent on the output voltage to be achieved, and charge pump stages can readily be added, up to the breakdown voltage of the isolation regions (i.e., ±20 V relative to the substrate). Thus for FIG. 6 the output voltage range is nominally from −9 volts at node 150 (also designated node "Y") to +9 volts at node 162 (also designated node "X"), with intermediate nominal voltages of −6 volts, −3 volts, 0 volts, ∓volts and +6 volts respectively at nodes 152, 154, 156, 158, and 160. In this case it is desired to provide output voltages of other than the maximum and minimum. Thus a switching network shown here as a set of logic selector elements (each having a switching function) 170, 172, 174, 176, 178 and 180 is provided to switch between each pair of voltages, i.e. logic element 180 switches between nominal output voltage 9 volts at node 162 and a nominal 6 volts at node 160.

As shown (only partly for simplicity), the output signal of logic element 180 is fed back as the $\phi_1$ (actually $\phi_{1A}$, $\phi_{1B}$) clock signal in order to drive the pump stage 148, while the output signal of logic element 178 is fed back as the $\phi_2$ (actually $\phi_{2A}$, $\phi_{2B}$) clock signal to also drive pump stage 148. Thus each logic element 170, ..., 180 includes appropriate internal logic such as a set of ring oscillators and associated flip-flops to provide the non-overlapped clock signals $\phi_{1A}$, $\phi_{1B}$, $\phi_{2A}$, $\phi_{2B}$ of FIG. 5b. (The remaining fed-back clock signals are omitted from FIG. 6 for simplicity.)

Thus the circuit of FIG. 6 provides a supply of nominally +9 volts to −9 volts, partitioned into (in this case) nominal 3 volt increments. Each of the supply voltage/ground voltage combinations of transistors described above, separated by the nominal 3 volt increments, has its own circuits completely isolated by the isolation layer of FIG. 2.

FIG. 7 is an example of combined high voltage output and level shifter circuitry using voltages supplied by the charge pump circuitry and using the high voltage transistors in accordance with the invention. A signal to be output is provided to conventional buffer 213, the output of which is connected to the gate of each of high voltage N-channel transistor 214a and P-channel transistors 215a, both of the type illustrated in FIG. 2. Transistors 214a, 214b in combination with resistors R1, R2, R3, R4 are the level shifter. Additionally, high voltage P−channel transistor 215b and N-channel transistor 214b, also of the type shown in FIG. 2, provide the high voltage output to node 216. The high voltage (V+) node X corresponds to node X (ref. no. 162) in FIG. 6; the low voltage (V−) node Y corresponds to node Y (ref. no. 150) in FIG. 6.

A polysilicon/N− doped region structure for capacitor 100 of FIG. 5a is shown in cross section in FIG. 8. Formed in P− doped epitaxial layer 61 on substrate 60 is an N− doped well 220 over which is formed (with an intermediate gate oxide layer, not shown), a polysilicon doped conductive electrode 224 to which is connected one lead of the capacitor, with the second lead being connected to the N+ doped region 226.

It is to be appreciated that in the charge pump of FIG. 5a, capacitor 100 (the semiconductor structure illustrated in FIG. 8) is formed on the same substrate 60 as are the remainder of the circuit elements (i.e., capacitor 100 is an on-chip capacitor). This is in contrast to the prior art where typically external (off-chip) capacitors are needed for such a charge pump to provide the necessary capacitance. However, here it is possible to use an integrated circuit (on chip) capacitor because the circuit, due to its relatively small CMOS feature size, is capable of operating at very high frequency, and also because the thin gate oxide typical of low voltage transistors permits a thin dielectric layer (hence having a high dielectric constant) in the capacitor. Thus using for instance a 100 Å thick gate oxide layer as the dielectric layer in the capacitor and operating the capacitor at 50 MHz substantially increases the available capacitance over that of a prior art integrated circuit capacitor.

A process for forming respectively the transistors of FIGS. 2, 4a, 4b and the capacitor of FIG. 8 is described hereinafter. It is to be understood that this is merely one example of a process for forming these structures, and hence is illustrative and not limiting.

The following steps 1–37 describe the process flow to form the N isolation layer and the associated N and P wells, as well as an intervening separation layers.

1. A conventional silicon wafer substrate which is lightly P doped is provided. A pad oxide layer 250 Å thick is conventionally grown on the principal surface thereof.

2. A pad nitride layer 1150 Å thick is formed on the pad oxide layer.

3. A first N isolation photoresist layer is deposited over the pad nitride layer, and then this photoresist layer is conventionally exposed using a first N isolation layer clear field mask to define the extent of a first N isolation layer.

4. After the exposed photoresist is developed, a nitride etch step etches through the exposed portion of the pad nitride layer, exposing a portion of the pad oxide.

5. A P-type implant is made of boron at a concentration of 5E12 at an energy of 90 kV. This implant is to form a P isolation layer (described below in conjunction with FIG. 9) adjacent to the first N-isolation layer and underlying non-isolated portions of the resulting structure.

6. Oxide is selectively grown over the principal surface to a thickness of 2500 Å on part of the surface; on remaining portions of the surface (those not exposed to previous implanting) the oxide grows to a lesser thickness.

7. The remaining portions of the pad nitride layer are conventionally stripped.

8. The first N isolation layer implant is made of arsenic at a concentration of 2E13 at an energy of 180 kV.

9. The first N isolation implant is driven in at 1,000° C. for 20 minutes.

10. A back seal oxide layer is grown conventionally over both the principal surface and backside of the substrate, to a thickness of 2,000 Å.

11. A back seal nitride deposition forms a layer of nitride 1,850 Å thick over both the principal surface and the backside surface of the substrate.

12. The back seal nitride layer on the principal surface is blanket etched.

13. The back seal oxide layer on the principal surface is also blanket etched.

14. A first epitaxial layer is grown to a thickness of 1.5 μm over the principal surface, having a conductivity of 3.5 ohm.centimeter due to arsenic present in the epitaxial layer.

The following steps 15 through 27 essentially replicate previous steps 1–13, except for different dosage and energy levels for the P and N type implants. Steps 15 through 27 form separation layers and step 28 forms a second epitaxial layer on the first epitaxial layer.

15. A second pad oxide layer 250 Å thick is grown over the surface of the first epitaxial layer.

16. A second pad nitride layer 1,150 Å thick is deposited over the second pad oxide layer.

17. A second N masking step using photoresist defines the extent of the N separation layer.

18. The second pad nitride layer is to expose a portion of the second pad oxide layer etch.

19. A second P type implant is made of boron at a concentration of 2E13 at 90 kV to form a P separation layer adjacent to the N separation layer.

20. A second layer of oxide is selectively grown to a thickness of 2500 Å over the principal surface as in step 6.

21. The remaining portions of the second pad nitride layer are stripped.

22. A second N layer implant is made of arsenic at a concentration of 6E15, at 75 kV for the N separation layer.

23. The second N layer is driven at 1000° C. for 20 minutes.

24. A second back seal oxide layer is grown to a thickness of 2,000 Å.

25. A second back seal nitride layer is deposited to a thickness of 1,850 Å.

26. The principal surface nitride layer is blanket etched.

27. The second principal surface oxide layer is blanket etched.

28. A second epitaxial layer is grown over the first epitaxial layer to a thickness of 1.87 μm, and dosed with arsenic to a conductivity of 4 ohms.centimeter.

The following subsequent steps form the N and P wells, as shown in FIGS. 2, 4a, and 4b.

29. A twin well pad oxide layer is grown to a thickness of 450 Å over the principal surface.

30. A twin well nitride layer is deposited to a thickness of 1350 Å over the twin well pad oxide.

31. A twin well mask step takes place using a dark field mask to conventionally pattern a photoresist layer to define the extent of the N and P wells.

32. The twin well nitride layer is etched.

33. An N well implant takes place through the etched nitride layer, implanting phosphorous at a concentration of 7.3E12 at 80 kV.

34. Oxide is selectively grown to a thickness of 5,600 Å over the principal surface.

35. The remaining portions of the twin well layer nitride are stripped.

36. A P well implant is made of boron at a concentration of 3.1E12 at 50 kV.

37. A twin well drive-in step drives in the N well and P well implants; this drive-in is such that it also grows a thin oxide layer of 160 Å thickness.

The resulting structure is shown in FIG. 9, differing somewhat from that of FIGS. 2 or 4a, 4b by including the first P doped layer 246 underlying non-isolated portions of the structure. Substrate 240 and first epitaxial layer 242 are conventional. N isolation layer 244 and first P layer 246 underly respectively the isolated and non-isolated portions of the structure. N well 252a is an isolation ring; P well 254a is an isolated P well; N well 252b is an isolated N well; P well 254b and N well 252c are not isolated. N separation layers 248a, 248b, and 248c prevent out-diffusion of underlying dopant into the overlying N wells, while P separation layers 250a, 250b prevent out-diffusion of underlying dopant into the overlying P wells. That is, the P and N doped separation layers provide counter doping.

The remaining steps (not described in detail) are a conventional CMOS process to form the active portions of the transistors. These steps are well known in the art and will be apparent to one of ordinary skill in the art in view of the completed structures of FIGS. 2, 3, 4a, 4b as well as FIG. 8 and hence are not further described.

The above description is illustrative and not limiting; further modifications will be apparent to one skilled in the art in light of the above description and are intended to be encompassed within the scope of the appended claims.

We claim:

1. A cascaded charge pump circuit formed on a single semiconductor substrate, comprising:

a plurality of N charge pumps, each charge pump i having a first and second input terminal and an output terminal;

a voltage supply terminal;

a voltage reference terminal;

and a circuit output terminal;

wherein the first input terminal of a first charge pump i=1 in the plurality of charge pumps is connected to the voltage supply terminal, and the second input terminal of the first charge pump is connected to the voltage reference terminal;

and wherein for each successive charge pump i, where i=2 to N, in the plurality of charge pumps, the first input terminal is connected to the output terminal of the i−1 charge pump, and the second input terminal is connected to the first input terminal of the i−1 charge pump;

and wherein the output terminal of the charge pump i=N is connected to the circuit output terminal; and each charge pump is electrically isolated on the semiconductor substrate from the other charge pumps.

2. The circuit of claim 1, further comprising a plurality of N+1 switch elements, each switch element k, where k=1 to N+1, being connected between the first input terminals of respectively associated charge pumps i and i+1, except for the k=N+1 switch element which is connected between the output terminal of charge pump N and the first input terminal of charge pump N, and the first switch element k=1 which is connected between the first and second input terminals of the first charge pump.

3. The circuit of claim 1, wherein each charge pump comprises:

a first stage and a second stage, each stage having at least one control terminal; and a capacitor operatively connected between the first and second stages.

4. The circuit of claim 3, wherein each stage includes:

two transistors, each having a gate terminal connected to a control terminal of the stage and each having an output terminal connected to the capacitor; and a diode connected across each of the two transistors.

5. The circuit of claim 3, wherein the cascaded charge pump circuit semiconductor substrate also includes the capacitor of each charge pump.

6. A method of generating a particular voltage level greater than a supply voltage level, comprising the steps of:

providing a cascaded set of charge pumps, all elements of which are formed on a single integrated circuit chip;

using the supply voltage level to generate an intermediate voltage higher than the supply voltage level by a predetermined amount using the cascaded charge pumps; and increasing the intermediate voltage by the predetermined amount n times, n being greater than one thereby generating a plurality of intermediate voltages; and wherein each charge pump is electrically isolated on the semiconductor substrate from the other charge pumps.

7. The method of claim 6, further comprising the steps of:

providing a plurality of switch elements connected to receive each of the plurality of intermediate voltages; and operating the switch elements to provide any one of the plurality of intermediate voltages as an output voltage.

* * * * *

UNITED STATES PATENT AND TRADEMARK OFFICE
CERTIFICATE OF CORRECTION

PATENT NO.    :   5,475,335
DATED         :   December 12, 1995
INVENTOR(S)   :   Merrill et al.

It is certified that error appears in the above-identified patent and that said Letters Patent is hereby corrected as shown below:

```
column 6, line 48, delete "output".
```

Signed and Sealed this

Third Day of September, 1996

Attest:

BRUCE LEHMAN

*Attesting Officer*    Commissioner of Patents and Trademarks